US008740205B2

(12) United States Patent
Ishino et al.

(10) Patent No.: US 8,740,205 B2
(45) Date of Patent: Jun. 3, 2014

(54) CONVEYOR AND DEPOSITION APPARATUS, AND MAINTENANCE METHOD THEREOF

(75) Inventors: Koji Ishino, Chigasaki (JP); Hajime Nakamura, Chigasaki (JP); Mayako Matsuda, Chigasaki (JP); Takaaki Shindou, Chigasaki (JP); Takaharu Koshimizu, Hachinohe (JP)

(73) Assignee: Ulvac, Inc., Chigasaki-Shi (JP)

( * ) Notice: Subject to any disclaimer, the term of this patent is extended or adjusted under 35 U.S.C. 154(b) by 836 days.

(21) Appl. No.: 12/596,264

(22) PCT Filed: Apr. 15, 2008

(86) PCT No.: PCT/JP2008/057339
§ 371 (c)(1),
(2), (4) Date: Oct. 16, 2009

(87) PCT Pub. No.: WO2008/129983
PCT Pub. Date: Oct. 30, 2008

(65) Prior Publication Data
US 2010/0126415 A1 May 27, 2010

(30) Foreign Application Priority Data
Apr. 16, 2007 (JP) ................................. 2007-106877

(51) Int. Cl.
*B25B 11/00* (2006.01)
(52) U.S. Cl.
USPC .................................. 269/55; 269/60; 269/71
(58) Field of Classification Search
USPC .................. 269/55, 60, 289 R, 302.1, 71, 75; 414/467, 667; 187/95, 9 E, 9 R, 239
See application file for complete search history.

(56) References Cited

U.S. PATENT DOCUMENTS 3,155,383 A * 11/1964 Whitmore ........................ 269/58
4,409,860 A * 10/1983 Moriyama et al. .......... 74/490.09
4,896,869 A *  1/1990 Takekoshi ........................ 269/60

(Continued)

FOREIGN PATENT DOCUMENTS

JP        1268870        10/1989
JP        8274142        10/1996

(Continued)

OTHER PUBLICATIONS

International Search Report dated May 27, 2008 issued in related International Patent Application No. PCT/JP2008/057339.

*Primary Examiner* — Lee D Wilson
(74) *Attorney, Agent, or Firm* — Grossman, Tucker, Perreault & Pfleger, PLLC

(57) ABSTRACT

A conveyor and a deposition apparatus, and a maintenance method thereof are disclosed. The conveyor includes a frame; a lower support mechanism for supporting a carrier on which is longitudinally mounted a substrate and for transferring the carrier; and an upper support mechanism for supporting the carrier, in which the frame comprises a lower frame and an upper frame, and in which the lower support mechanism is provided on the lower frame and the upper support mechanism is provided on the upper frame, the upper frame and the lower frame being configured to be separately movable. Therefore, with the rotational movement of the upper frame, it is possible to arrange a cathode member in a space formed above the lower frame. This can make the spacing between the deposition treatment passage and the carrier transfer passage small. As a result, it is possible to make an inner court of the deposition apparatus narrow. Therefore, in the conveyor capable of transferring a carrier and in the deposition apparatus including the conveyor and further including a vacuum treatment apparatus and a transfer system, it is possible to make the installation area thereof small and narrow.

5 Claims, 9 Drawing Sheets

(56) References Cited

U.S. PATENT DOCUMENTS

| | | | |
|---|---|---|---|
| 5,623,853 A * | 4/1997 | Novak et al. | 74/490.09 |
| 5,760,564 A * | 6/1998 | Novak | 318/687 |
| 5,839,324 A * | 11/1998 | Hara | 74/490.09 |
| 5,996,437 A * | 12/1999 | Novak et al. | 74/490.09 |
| 7,377,502 B2 * | 5/2008 | Nikolic | 269/17 |
| 7,448,606 B1 * | 11/2008 | Johnson | 269/17 |
| 7,823,273 B2 * | 11/2010 | Braun | 29/822 |
| 7,959,141 B2 * | 6/2011 | Makino | 269/58 |
| 2010/0126415 A1 * | 5/2010 | Ishino et al. | 118/500 |

FOREIGN PATENT DOCUMENTS

| | | |
|---|---|---|
| JP | 2002309372 | 10/2002 |
| JP | 2003229468 | 8/2003 |

* cited by examiner

CONVEYOR AND DEPOSITION APPARATUS, AND MAINTENANCE METHOD THEREOF

TECHNICAL FIELD

The present invention relates to a conveyor and a deposition apparatus. Priority is claimed on Japanese Patent Application No. 2007-106877, filed on Apr. 16, 2007, the contents of which are incorporated herein by reference.

BACKGROUND ART

In the manufacturing process of liquid crystal displays and the like, a large-size glass substrate is subjected to a vacuum treatment such as a heating treatment and a deposition treatment. Therefore, a variety of vacuum treatment apparatuses have been developed. In one of them, a carrier-circulation-type in-line sputtering apparatus is used for depositing an ITO film (an electrode film) on the color filter side of the liquid crystal display (for example, see Patent Document 1).

Sputtering apparatuses include a type of sputtering apparatus in which a glass substrate after sputtering is rotated or traversed in the vacuum and is then returned in the vacuum (a vacuum return type) and a type of sputtering apparatus in which a glass substrate transferred from the vacuum to the atmosphere is rotated or traversed and then returned (an atmosphere return type). In addition, there is also a type of sputtering apparatus in which carriers opposed to each other are transferred through the vacuum, sorted by the rotation mechanism on the atmosphere side, and returned one by one (an atmosphere return type on the double-side deposition system). Here, an atmosphere return type sputtering apparatus includes a vacuum apparatus that creates a vacuum state for depositing a thin film on a glass substrate by sputtering, and an atmosphere transfer system that transfers a carrier outside the vacuum treatment apparatus, on the carrier is mounted a glass substrate before and after deposition. In the atmosphere return type sputtering apparatus, there exists a region (an inner court) surrounded by the vacuum treatment apparatus and the atmosphere transfer system. The glass substrate is attached to a carriage called a carrier for a stable transfer of the glass substrate in the sputtering apparatus.

In the atmosphere transfer system, a carrier is transferred by a conveyor. In a mechanism of the conveyor, a rack & pinion or rollers are used as a lower support mechanism and, as required, a non-contact mechanism using a magnet is used as an upper support mechanism. Here, to avoid cracking of the glass substrate mounted on the carrier, an occurrence of particles from the carrier, and a transfer trouble, the alignment of the transfer line of the conveyors is adjusted with special priority. To avoid the alignment discrepancies and the displacement of the transfer line over time, and for easiness of adjustment, the lower support mechanism and the upper support mechanism are attached onto the same frame, and the frame is firmly fixed onto the floor surface once it is adjusted, to thereby prevent displacement.

Patent Document 1: Japanese Unexamined Patent Publication, First Publication No. 2002-309372 (FIG. 4)

In the in-line type deposition apparatus described in FIG. 4 of the aforementioned Patent Document 1, it is indispensable to regularly replace the deposition prevention plate that prevents the deposition onto a vacuum chamber or a target of a sputtering chamber and to regularly check the other mechanical systems and the like. Here, FIG. 13 shows a general configuration of a conventional deposition apparatus. Maintenance work on a sputtering chamber 34 is done in a state with cathode members 80 provided with targets being reclined from the sputtering chamber 34 as shown in FIG. 13.

However, in a deposition apparatus 110 with a configuration where a cathode member 80 reclines from the sputtering chamber 34 toward an atmosphere transfer system 115, a lower support mechanism and an upper support mechanism of a conveyor 40 are immovable. Therefore, a spacing between the vacuum treatment apparatus 113 and the atmosphere transfer system 115 are required to be spaced so that the cathode member 80 and the atmosphere transfer system 115 do not overlap when seen in a planar view. That is, as shown in FIG. 13, it is necessary to broaden an inner court 117, leading to a problem of an increased installation area required for the deposition apparatus 110. Furthermore, recent years have seen progress in upsizing glass substrates. Accordingly, a maintenance mechanism 111 of the cathode member 80 have been upsized, leading to a problem in that it is obligatory to secure a wider inner court 117.

DISCLOSURE OF INVENTION

Therefore, the present invention has been achieved in view of the aforementioned circumstances, and has an object to provide a conveyor capable of transferring a carrier and to provide a deposition apparatus including the conveyor, a vacuum treatment apparatus, and a transfer system, the conveyor and the deposition apparatus being capable of making the installation areas thereof small and narrow.

According to a first aspect of the present invention, a conveyor comprising a frame, a lower support mechanism for supporting a carrier on which is longitudinally mounted a substrate and for transferring the carrier, and an upper support mechanism for supporting the carrier, wherein the frame comprises a lower frame and an upper frame, and the lower support mechanism is provided on the lower frame and the upper support mechanism is provided on the upper frame, the upper frame and the lower frame being configured to be separately movable.

In this case, an advantage is obtained in that it is possible to shift the positional relationship between the upper frame provided with the upper support mechanism and the lower frame provided with the lower support mechanism.

Furthermore, the lower support mechanism is attached to the lower frame, and transfers the carrier while supporting the load of the carrier by means of the lower support mechanism. Therefore, it is possible to accurately transfer the carrier in a state where a transfer route of the lower support mechanism is accurately positioned. Consequently, an advantage is obtained in that it is possible to prevent cracking of the substrate mounted on the carrier, an occurrence of particles from the carrier, and transfer trouble.

The lower frame may be supportedly fixed on a floor surface, and the upper frame may be joined to any one of vertical shafts that support the lower frame on the floor surface, the upper frame being configured to be rotationally movable about the vertical shaft.

In this case, only the upper support mechanism can be rotationally moved in a state the lower support mechanism is fixed. Therefore, an advantage is obtained in that it is possible to retain the accuracy of the lower support mechanism. Furthermore, the upper frame is configured to be rotationally movable about the vertical shaft that fixes the lower frame on the floor surface. Therefore, an advantage is obtained in that it is possible to form a space above the lower frame with ease, and also to return and position the upper frame above the lower frame with ease.

The upper support mechanism may support the carrier in a non-contact manner.

In this case, the upper support mechanism is configured to be transferable without contacting the carrier. Therefore, an advantage is obtained in that it is possible to securely transfer the carrier without causing problems in the transfer of the carrier even if the position of the upper frame (the upper support mechanism) is slightly displaced.

A first roller that rolls along the floor surface while supporting the upper frame on the floor surface may be provided on a near in a rotational movement direction of the upper frame, a second roller that rolls along the floor surface while supporting the upper frame on the floor surface may be provided on a far side in the rotational movement direction of the upper frame, and the second roller may be configured to be movable to a position that does not interfere with the lower frame when the upper frame is rotationally moved.

In this case, when the upper frame is rotationally moved, it is possible to support the load of the upper frame on the floor surface at three points by the vertical shaft joined to the lower frame, the first roller, and the second roller. Therefore, an advantage is obtained in that it is possible to rotationally move the upper frame securely without allowing the upper frame to be reclined by its own weight.

Furthermore, the second roller is configured to be retractable. Therefore, in the rotational movement of the upper frame, only when the second roller interferes with the lower frame, the second roller is moved into a position that does not cause the interference. At other times, the second roller can be used for supporting the upper frame on the floor surface, leading to an advantage of increased efficiency.

In a deposition apparatus comprising a carrier for transferring a substrate while longitudinally supporting the substrate, a deposition treatment passage for performing a deposition treatment on the substrate mounted on the carrier, and a carrier transfer passage that is arranged in parallel with the deposition treatment passage, with a constituent member of the deposition treatment passage is configured to be movable toward the carrier transfer passage, the carrier transfer passage may be provided with to any of the above-mentioned conveyors, wherein the upper frame may be configured to be movable to a position capable of avoiding interference with the constituent member of the deposition treatment passage that has been moved.

In this case, the upper frame can be moved to form a space above the lower frame, and also the constituent member of the deposition treatment passage that has been moved can be arranged in the space. Therefore, it is possible to bring the deposition treatment passage and the carrier transfer passage closer together. Consequently, an advantage is obtained in that it is possible to make the installation area of the deposition apparatus small and narrow.

The constituent member of the deposition treatment passage may be a support member for a target of a sputtering treatment apparatus.

In this case, when the sputtering treatment apparatus is maintained, a rotational movement of the upper frame can arrange the support member for the target of the sputtering treatment apparatus in the space formed above the lower frame. Therefore, it is possible to make the spacing between the deposition treatment passage and the carrier transfer passage smaller. Consequently, an advantage is obtained in that it is possible to make the installation area of the deposition apparatus including the deposition treatment passage and the carrier transfer passage small and narrow.

A maintenance method of the deposition apparatus, comprising a step of separating the upper frame from the lower frame and moving the upper frame to a retracted position, and a step of laying flat the constituent member of the deposition treatment passage above the lower frame to maintain the constituent member of the deposition treatment passage.

In this case, the upper frame can be moved to form a space above the lower frame, and also the constituent member of the deposition treatment passage that has been moved can be arranged in the space. Therefore, it is possible to bring the deposition treatment passage and the carrier transfer passage closer. Consequently, an advantage is obtained in that it is possible to make the installation area of the deposition apparatus small and narrow.

According to the present invention, in the maintenance of the deposition apparatus, a rotational movement of the upper frame of the conveyor can form a space above the lower frame, and also a constituent member of the deposition apparatus can be arranged in the space. Therefore, it is possible to bring the deposition treatment passage and the carrier transfer passage closer. Consequently, an advantage is obtained in that it is possible to make the installation area of the deposition apparatus small and narrow.

DESCRIPTION OF THE REFERENCE SYMBOLS

Figure 1:
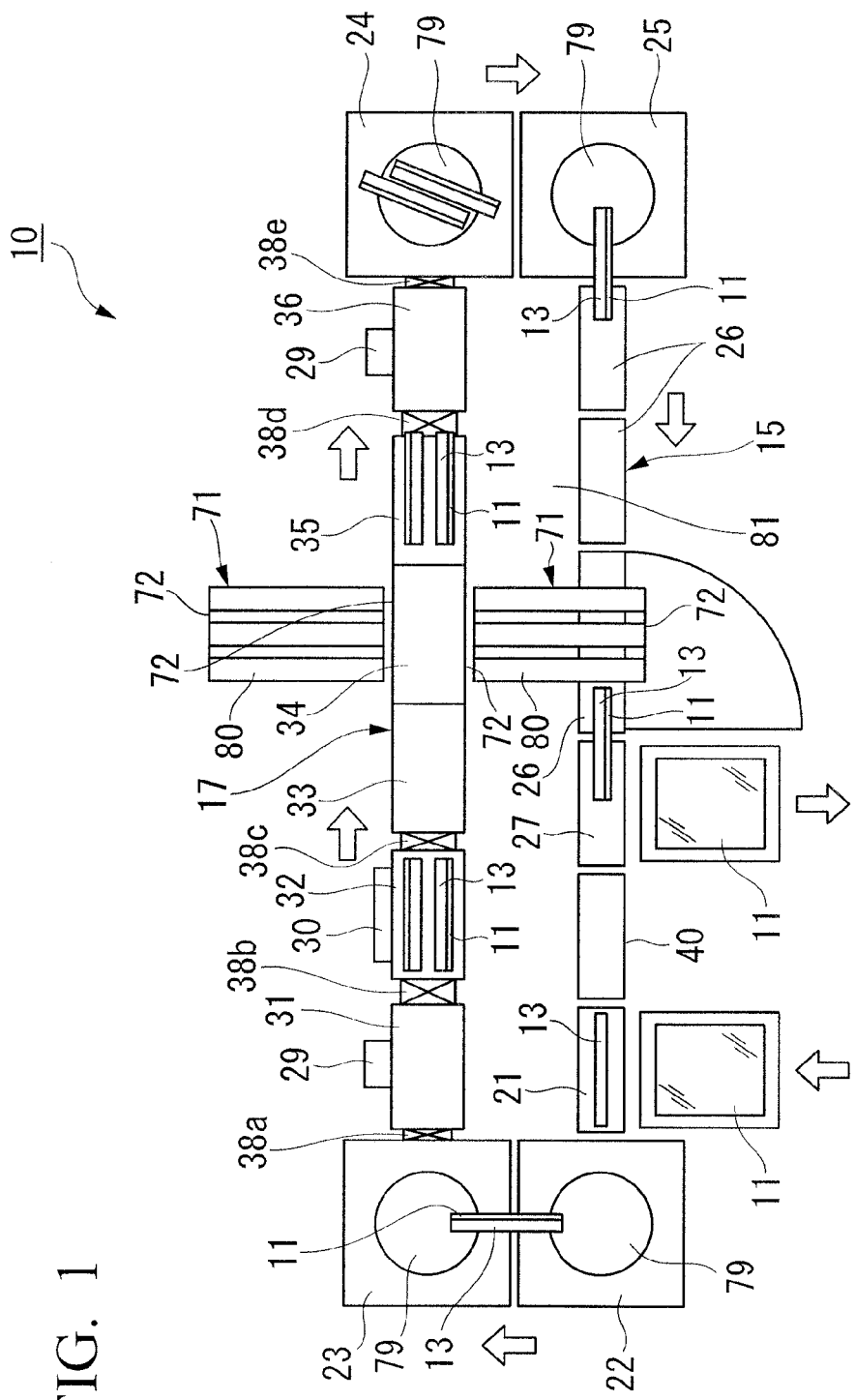
FIG. 1 is a schematic diagram showing a general constitution of a sputtering apparatus according to an embodiment of the present invention.

10: deposition apparatus, 11: glass substrate (substrate), 13: carrier, 15: carrier transfer passage, 17: deposition treatment passage, 34: sputtering chamber (sputtering treatment apparatus), 40: conveyor, 41: frame, 43: lower support mechanism, 45: upper support mechanism, 47: lower frame, 49: upper frame, 55: vertical shaft, 59: first roller, 61: second roller, 80: cathode member (constituent member, supporting member for target), FL: floor surface

BEST MODE FOR CARRYING OUT THE INVENTION

Next is a description of an embodiment of the present invention based on FIG. 1 to FIG. 12. In the drawings used for the following description, scales of respective members are appropriately modified for easy recognition of the respective members.

(Deposition Apparatus)

FIG. 1 is a planar view showing a general construction of a deposition apparatus.

As shown in FIG. 1, a deposition apparatus 10 in which carriers 13 for holding glass substrates 11 longitudinally are arranged for longitudinally includes a carrier transfer passage 15 which transfers the carriers 13 under an atmospheric pressure, and a deposition treatment passage 17 which performs deposition on the glass substrates 11 under a vacuum condition. Here, the deposition apparatus 10 is a deposition apparatus on the double-side deposition system with a constitution where the carriers 13 are allowed to be transferred two abreast through the deposition treatment passage 17 and where deposition is allowed from both sides in a sputtering chamber 34, which will be described later.

The deposition treatment passage 17 includes a load lock chamber 31 joined to a second rotation portion 23 and including a vacuum exhaustion apparatus 29, a heating chamber 32 having a heater 30, a sputtering inlet chamber 33 that adjusts the distance between the carriers 13 adjacent in the direction of travel, a sputtering chamber 34 that performs deposition on the glass substrates 11, a sputtering outlet chamber 35 that adjusts the distance between the carriers 13 adjacent in the direction of travel, and an unload lock chamber 36 including a vacuum exhaustion apparatus 29, the constituent elements are aligned in this order. The unload lock chamber 36 is connected to a third rotation portion 24 of the carrier transfer passage 15.

Furthermore, between the second rotation portion 23 and the load lock chamber 31 is provided a gate valve 38*a*. Similarly, between the load lock chamber 31 and the heating chamber 32 is provided a gate valve 38*b*. Between the heating chamber 32 and the sputtering inlet chamber 33 is provided a gate valve 38*c*. Between the sputtering outlet chamber 35 and the unload lock chamber 36 is provided a gate valve 38*d*. Between the unload lock chamber 36 and the third rotation portion 24 is provided a gate valve 38*e*.

Furthermore, in each maintenance mechanism 71 of the sputtering chamber 34, a side surface 72 reclines, the side surface 72 being in parallel with the deposition treatment passage 17. On the side surface 72 are arranged a cathode member 80 as a support member of a target, a deposition prevention plate that prevents deposition on the inside of the sputtering chamber 34, and the like. When the cathode member 80 is maintained through the replacement of the target or the like, it is configured such that the maintenance is performed with the side surface 72 being reclined by the maintenance mechanism 71.

Figure 2:
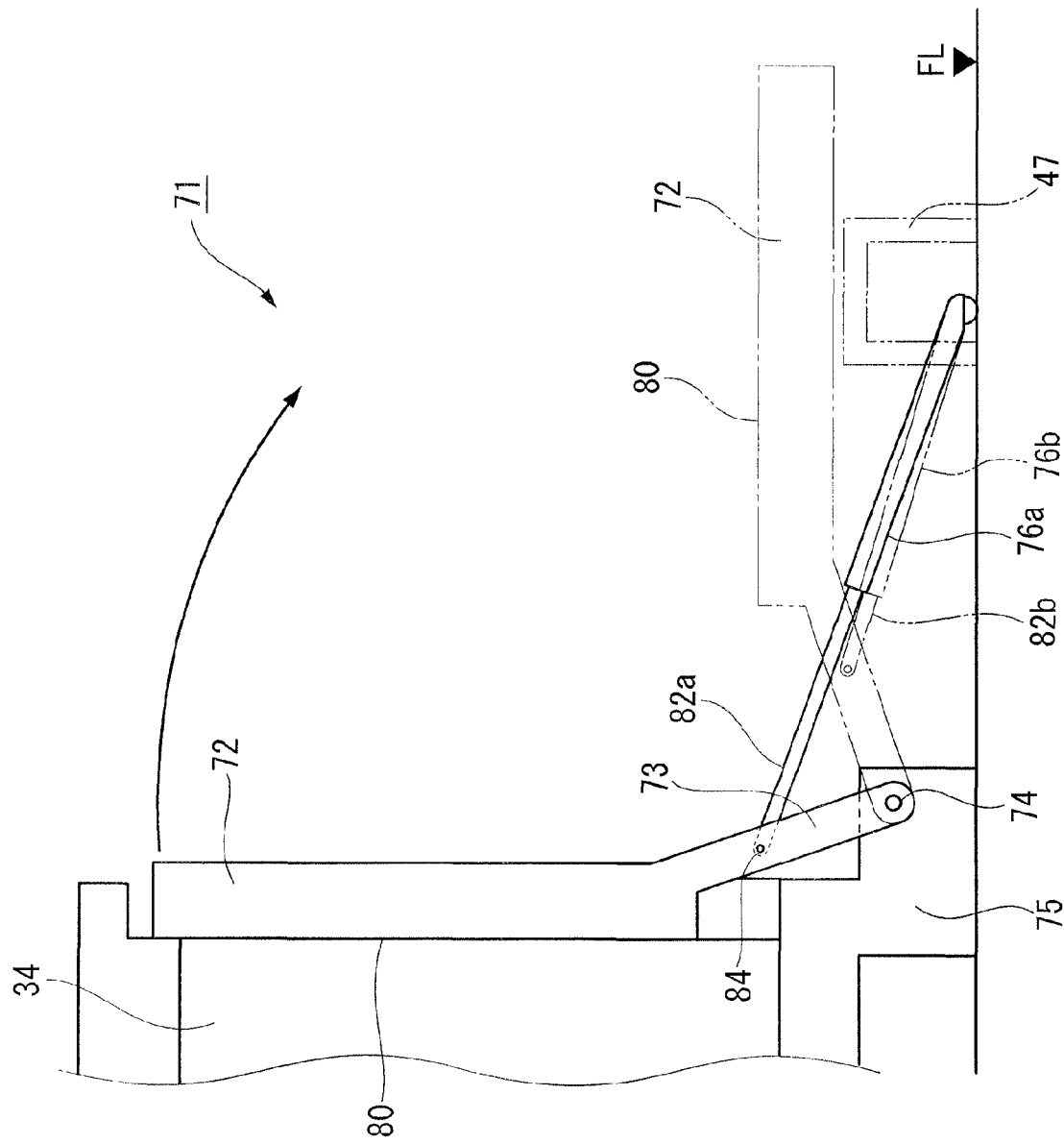
FIG. 2 is an explanatory diagram showing an operation of a maintenance mechanism of a sputtering chamber according to the embodiment of the present invention.

FIG. 2 is an explanatory diagram showing a schematic construction of the maintenance mechanism 71.

As shown in FIG. 2, a leg 73 extends from the lower portion of the side surface 72. The side surface 72 is connected to a lower structure 75 of the sputtering chamber 34 via a rotational movement shaft 74 in the vicinity of the lower end of the leg 73. On the side surface 72 are integrally formed a plurality of (four, in the present embodiment) legs 76. The leg 76 is made of a power cylinder. A shaft portion 82 thereof is connected to the lower structure 75 via a rotational movement shaft 84. It is configured such that the shaft portion 82 is extendable and retractable by the power cylinder.

Returning to FIG. 1, the carrier transfer passage 15 is made of: an inlet portion 21 for taking a glass substrate 11, which has been transferred from another place, into the deposition apparatus 10; a first rotation portion 22 and a second rotation portion 23 that rotate the glass substrate 11 and introduce it into the deposition treatment passage 17; a third rotation portion 24 and a fourth rotation portion 25 that rotate the glass substrate 11 completed with deposition in the deposition treatment passage 17 and introduce it into an outlet portion 27, which will be described later; transfer portions 26 through which the glass substrate 11 with deposition is transferred; and an outlet portion 27 at which the glass substrate 11 is taken out from the deposition apparatus 10.

The carrier transfer passage 15 is retained in an environment under an atmospheric pressure. To exclude particles and keep the cleanness high, a HEPA filter is used and a downward airflow is produced in order to keep the atmosphere in the carrier transfer passage 15 clean.

Furthermore, it is configured such that the glass substrate 11 is transferred in a horizontal state from another place, raised substantially upright in the inlet portion 21, and then mounted onto the carrier 13. In the outlet portion 27, it is configured such that the glass substrate 11 is removed from the carrier 13 in a procedure reverse to that of the inlet portion 21.

Figure 3:
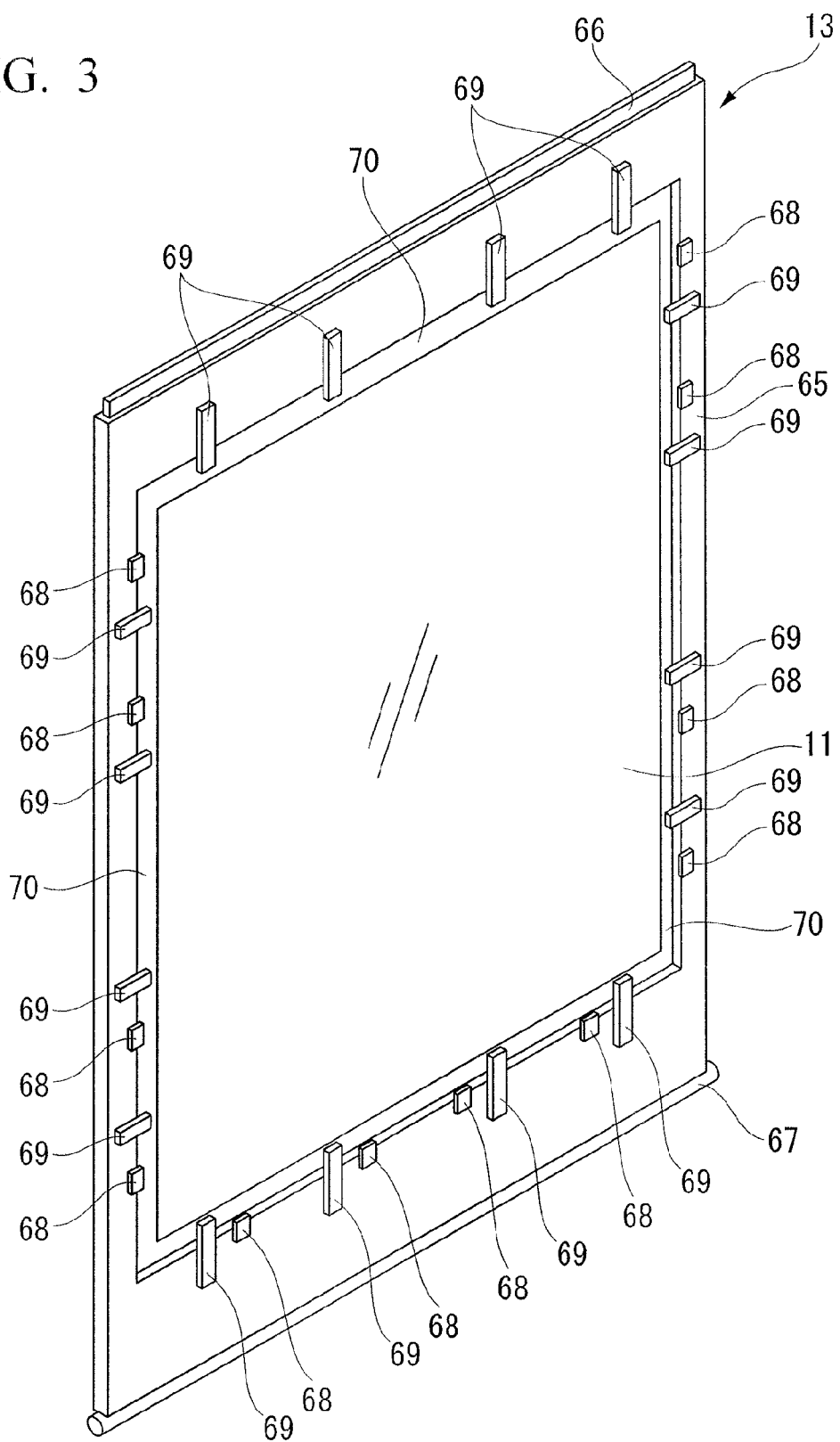
FIG. 3 is a perspective view of a glass substrate mounted on a carrier according to the embodiment of the present invention.

FIG. 3 is a perspective view showing a schematic construction of the carrier 13.

As shown in FIG. 3, the carrier 13 includes a rectangular carrier frame 65 made from aluminum or the like, a magnet 66 provided along a top edge of the carrier frame 65, a slider 67 provided along a bottom edge of the carrier frame 65, the slider 67 being made of a round bar, substrate brackets 68 for receiving a load of the glass substrate 11 and holding the levelness of the glass substrate 11, clamps 69 for holding the glass substrate 11 on the carrier 13, and a mask 70 for covering a non-deposition region in the periphery of the glass substrate 11.

It is configured such that the carrier 13 on which the glass substrate 11 is mounted is movable through the carrier transfer passage 15 and the deposition treatment passage 17.

(Conveyor)

Figure 4:
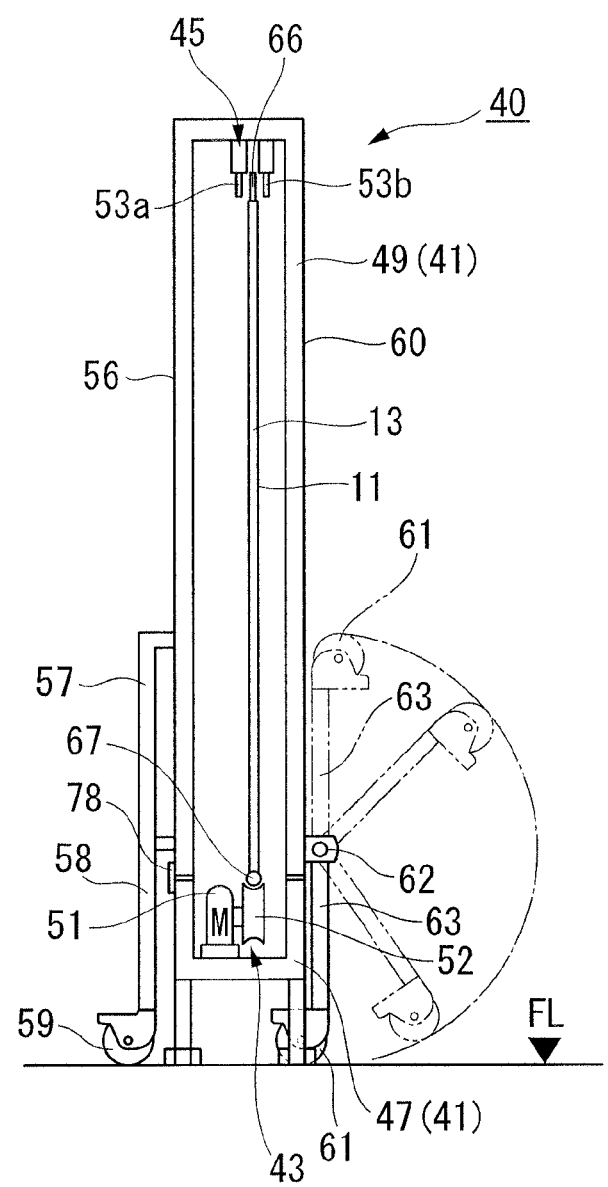
FIG. 4 is a side view showing the conveyor according to the embodiment of the present invention.

FIG. 4 is a cross-sectional view of a conveyor 40. As shown in FIG. 4, the conveyor 40 includes a frame 41 assembled of steel members, a lower support mechanism 43 configured to be capable of transferring a carrier 13 while supporting a load of the carrier 13, and an upper support mechanism 45 configured to be capable of supporting an upper portion of the carrier 13 in a non-contact manner.

Here, the frame 41 is made of a lower frame 47 on which the lower support mechanism 43 is provided, and an upper frame 49 on which the upper support mechanism 45 is provided. A carrier 13 is configured to be movable in the frame 41 in a horizontal direction while being held substantially upright by the lower support mechanism 43 and the upper support mechanism 45. With the upsizing of a glass substrate 11, the frame 41 is formed with a size, for example, of approximately 4600 mm high and 600 mm wide (only for the frame portion).

Figure 5:
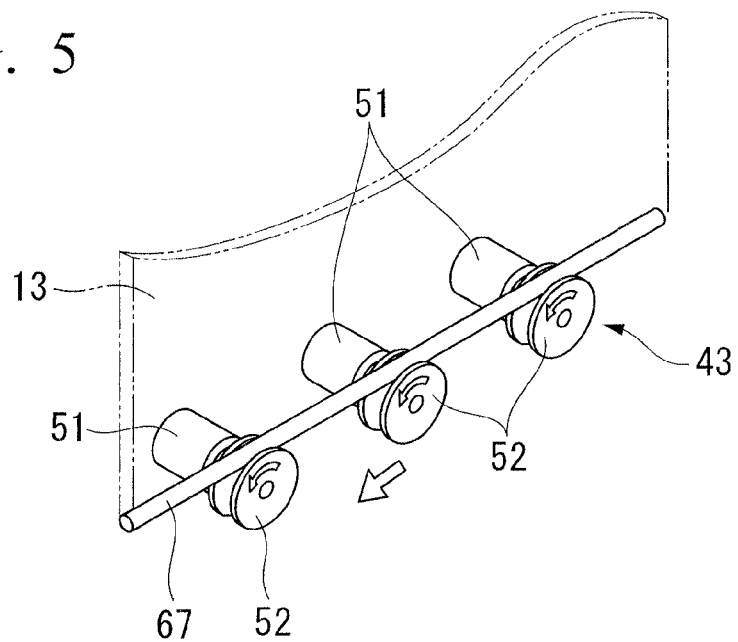
FIG. 5 is a perspective view showing the constitution of a lower support mechanism of the conveyor according to the embodiment of the present invention.

FIG. 5 is a perspective view showing a constitution of the lower support mechanism 43 of the conveyor 40.

As shown in FIG. 5, the lower support mechanism 43 includes motors 51 and rollers 52. It is configured such that, with the drive of the motors 51, the rollers 52 roll to cause the carrier 13 to move horizontally on the rollers 52. To be more specific, the slider 67, which will be described later, provided on the bottom portion of the carrier 13 engages groove portions in the outer circumferences of the rollers 52, making it possible for the carrier 13 to move horizontally. The plurality of rollers 52 provided in a single lower frame 47 allows the carrier 13 to move horizontally without a hitch.

Figure 6:
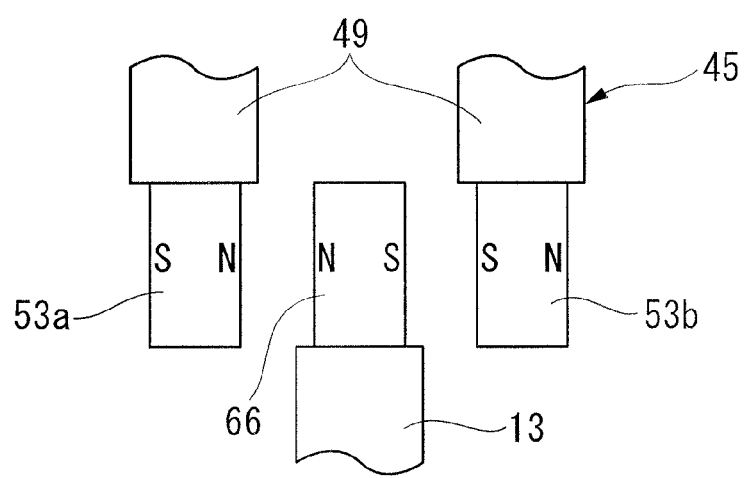
FIG. 6 is a schematic diagram showing the constitution of an upper support mechanism of the conveyor according to the embodiment of the present invention.

FIG. 6 is an explanatory diagram showing a constitution of the upper support mechanism 45 of the conveyor 40.

As shown in FIG. 6, in the upper support mechanism 45, a pair of magnets 53a, 53b is provided on an upper portion of the upper frame 49 so as to be spaced laterally from a region through which the top edge of the carrier 13 passes. The pair of magnets 53a, 53b are attached so that the N pole and the S pole thereof are opposed to each other. Furthermore, a plural pairs of magnets 53a, 53b are provided on the upper frame 49. In addition, a magnet 66, which will be described later, is attached on a top edge of the carrier 13. It is configured such that the magnet 66 passes between the pairs of magnets 53a, 53b of the upper frame 49. The arrangement is such that the N pole of the magnet 53a is opposed to the N pole of the magnet 66 and that the S pole of the magnet 53b is opposed to the S pole of the magnet 66.

With this construction, the magnets repel each other, making it possible to hold the carrier 13 in an upright state. That is, with the glass substrate 11 being held upright, it is possible to suppress an increase in the installation area of the deposition apparatus 10 resulting from the upsizing of the glass substrate 11, and also to evade the influence by the deflection of a large-size substrate.

Returning to FIG. 4, the lower frame 47 provided with the lower support mechanism 43 is fixed on a floor surface FL. That is, the lower support mechanism 43 has its position adjusted in an installation stage of the deposition apparatus 10 so that the carriers 13 can be moved securely in the horizontal direction, and also has its position adjusted with respect to a lower support mechanism 43 of an adjacent frame 41. It is configured such that, after the adjustments, the lower support mechanism 43 will not be displaced.

The lower support mechanism 43 transfers the carrier 13 with the rollers 52. The rollers 52 transfer the carrier 13, on which the glass substrate 11 is mounted, in the horizontal direction while receiving the load thereof. Therefore, if a slight displacement is produced in the transfer route, the carrier 13 vibrates in the transfer. This produces particles, resulting in undesirable situations such as a decrease in yield. Therefore, positional accuracy is required for the lower support mechanism 43. It is desirable that, after its position is adjusted, the lower support mechanism 43 be fixed at that position.

Figure 7:
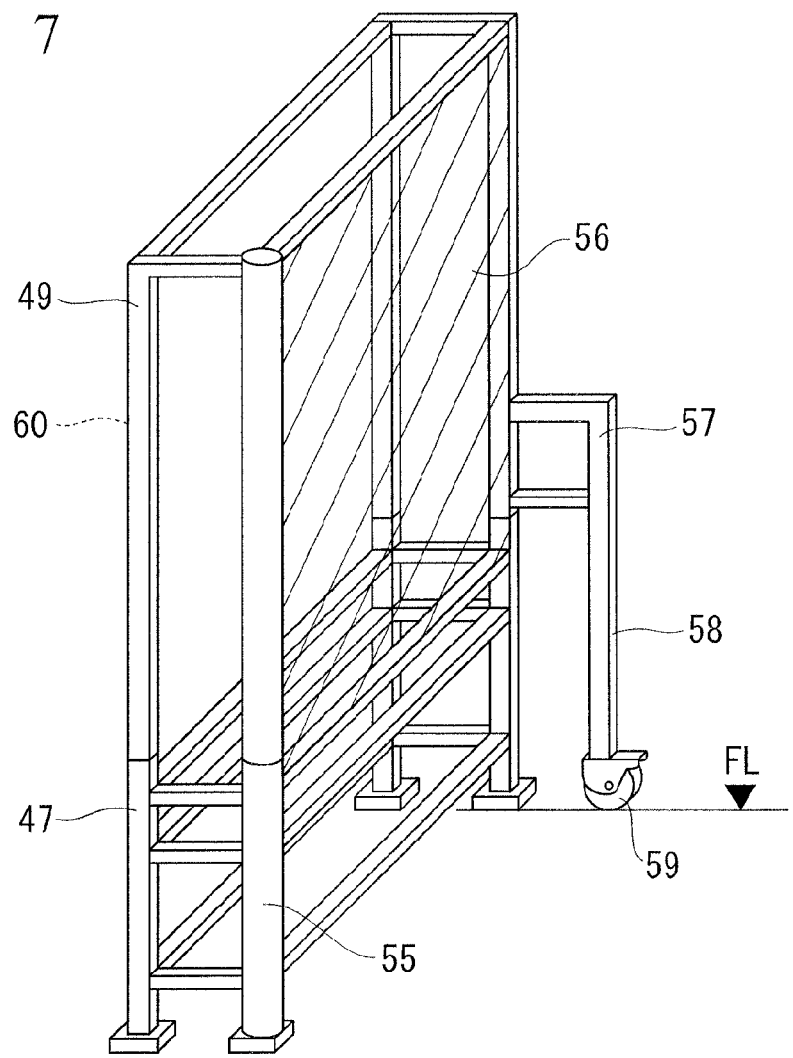
FIG. 7 is a perspective view showing a frame construction of the conveyor according to the embodiment of the present invention.

FIG. 7 is a perspective view showing a frame constitution of the conveyor 40.

As shown in FIG. 7, the upper frame 49 is rotationally movably joined to a single vertical shaft 55 of the lower frame 47, and is arranged directly above the lower frame 47. On a side surface 56 on a near side in the rotational movement direction of the upper frame 49, a handle 57 is provided that is used for rotationally moving the upper frame 49. Additionally, a leg 58 extends toward the floor surface FL so as to join to the handle 57. At a front end of the leg 58, a first roller 59 is provided so as to be in contact with the floor surface FL.

Returning to FIG. 4, on a side surface 60 opposed to a side surface (a surface on the near side in the rotational movement direction) 56 to which the first roller 59 is attached, a second roller 61 is provided. The second roller 61 is provided at a front end of a leg 63. The leg 63 is connected to the upper frame 49 via a rotational movement shaft 62. It is configured such that, when the upper frame 49 is rotationally moved, the second roller 61 is movable to a position that does not interfere with the lower frame 47. Here, the second roller 61 is configured to pivot around the rotational movement shaft 62, as if drawing a substantial semicircle in a vertical cross-section to contact with the floor surface FL. In a state with the second roller 61 being retracted, the second roller 61 is held on the upper frame 49 by means of a stopper member (not shown in the figure). In FIG. 4, the second roller 61 is configured to retract through rotational movement about the rotational movement shaft 62. However, it is permissible that the second roller 61, when the upper frame 49 is rotationally moved, be moved to a position that does not interfere with the lower frame 47 and be returned to its original position with high level of accuracy. Therefore, for example, it may be configured such that the leg 63 be retracted through parallel movement in the perpendicularly upward direction. Alternatively, the leg 63 may be made detachable by use of a positioning cup ring or the like. Furthermore, when the carrier 13 is transferred (a state where the upper frame 49 is arranged directly above the lower frame 47) and when the upper frame 49 is rotationally moved, the second roller 61 also plays a role of receiving the load thereof. Therefore, it is desirable that the second roller 61 be attached to a position away from the vertical shaft 55.

Figure 8:
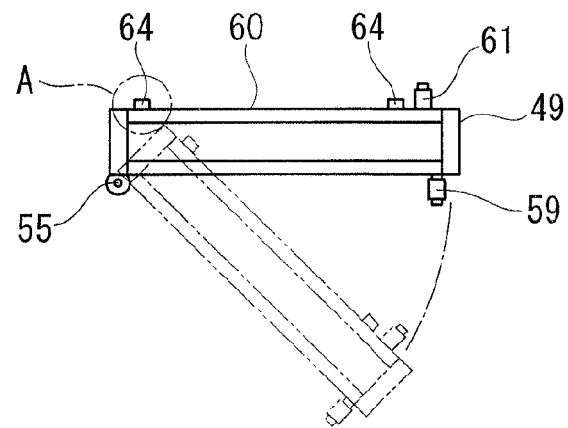
FIG. 8 is a planar view showing the frame construction of the conveyor according to the embodiment of the present invention.
Figure 9:
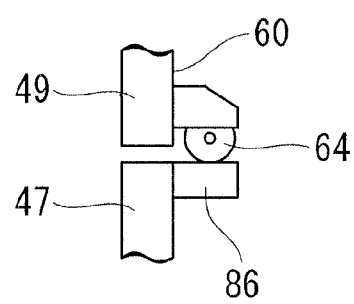
FIG. 9 is an enlarged side view of an A portion of FIG. 8.

FIG. 8 is a planar view showing the frame constitution of the conveyor 40. FIG. 9 is a detailed side view of the A portion of FIG. 8.

As shown in FIG. 8 and FIG. 9, a load bearing guide roller 64 is provided on the side surface 60 side of the upper frame 49, on a border portion with the lower frame 47. The load bearing guide roller 64 is provided at two sites on the side surface 60. When the upper frame 49 is positioned above the lower frame 47 (in a normal state), each of the load bearing guide roller 64 is configured to be brought into contact with a reception portion 86, which is formed integrally with the lower frame 47 so as to protrude laterally from the lower frame 47.

With the load bearing guide rollers 64 being brought into contact with the reception portions 86, a part of the load of the upper frame 49 is transmitted to the lower frame 47. Thereby, the upper frame 49 comes to be supported by the lower frame 47. With this construction, the upper frame 49 in the normal state is supported at its four corners by the first roller 59, the second roller 61, the vertical shaft 55, and the load bearing guide rollers 64. This makes it possible for the upper frame 49 to maintain a stable state.

Between the upper frame 49 and the lower frame 47 is provided a locking part (not shown in the figures). The locking part includes, for example, a handle, and is configured such that with a rotation (a turn) of the handle, a shaft provided on one of the upper frame 49 and the lower frame 47 is inserted through a hole formed in the other. This causes the upper frame 49 to engage the lower frame 47, enabling alignment.

In addition, between the upper frame 49 and the lower frame 47 is formed a gap of approximately 20 mm A dust protection rubber (not shown in the figures) is placed in the gap. For the dust protection rubber, one with a semicircular shape in the cross-section may be used. With this, it is possible to improve a dust protective performance of the frame.

On the side surface 56 of the upper frame 49 is provided a stopper member 78 that abuts the lower frame 47 so as not to allow for over rotational movement thereof, to thereby prevent any further rotational movement (see FIG. 4). After the stopper member 78 is in abutment with the lower frame 47, the upper frame 49 and the lower frame 47 are engaged with the locking part, to thereby align the upper frame 49 with the lower frame 47.

(Substrate Deposition Method)

Next is a description of an operation when deposition is performed on a glass substrate 11 based on FIG. 1 and the like.

The glass substrate 11 is transferred in a horizontal state from another place to the front of the inlet portion 21 of the deposition apparatus 10. After that, the glass substrate 11 is raised so as to be in an upright state, and is then mounted onto the carrier 13 which is placed in the inlet portion 21. At this time, the glass substrate 11 is set so as to be in abutment with the substrate brackets 68 of the carrier 13. Subsequently, glass substrate 11 is held on carrier 13 by means of the clamps 69 (see FIG. 3).

The carrier 13 on which the glass substrate 11 is mounted starts moving with the rolling of the rollers 52 of the lower support mechanism 43 (see FIG. 5), and is transferred to the first rotation portion 22. In the first rotation portion 22, the carrier 13 in a state of being mounted on the rotary table 79 is first rotated substantially 90 degrees about a vertical axis, and is then transferred to the second rotation portion 23. In the second rotation portion 23, the carrier 13 is further rotated substantially 90 degrees about the vertical axis on a rotary table 79, setting the carrier 13 in an orientation that allows for the transfer to the load lock chamber 31 of the deposition treatment passage 17. Then, after the gate valve 38a is in an open state, the carrier 13 is transferred to the load lock chamber 31.

When the carrier 13 is transferred to the load lock chamber 31, the gate valve 38a is set in a closed state. After that, air is exhausted from the load lock chamber 31 by means of the vacuum exhaustion apparatus 29, to thereby set the chamber in a vacuum state. After the load lock chamber 31 is set in a vacuum state, the gate valve 38b is set in an open state, and the carrier 13 is transferred to the heating chamber 32.

When the carrier 13 is transferred to the heating chamber 32, the gate valve 38b is set in a closed state. After that, the glass substrate 11 is heated by means of the heater 30. After completion of heating of the glass substrate 11, the gate valve 38c is set in an open state, and the carrier 13 is transferred to the sputtering inlet chamber 33.

When the carrier 13 is transferred to the sputtering inlet chamber 33, the gate valve 38c is set in a closed state. After that, the carrier 13 is moved to a position so as to be in contact with a rear end of a preceding carrier positioned. It is configured such that, at a stage where the carrier 13 has been positioned at a rear end of the carrier in front, the carrier 13 is at the same speed as that of the preceding carrier. With this constitution, it is possible to sequentially perform deposition on the glass substrates 11 in the sputtering chamber 34. Therefore, it is possible to efficiently perform deposition.

In this state, the carrier 13 is transferred to the sputtering chamber 34. In the sputtering chamber 34, the glass substrate 11 is subjected to deposition by the general sputtering method. Here, on the periphery of the glass substrate 11, the mask 70 is arranged (see FIG. 3). Therefore, it is configured such that only a required region on the glass substrate 11 is subjected to deposition. After completion of deposition, the carrier 13 is transferred to the sputtering outlet chamber 35.

When the carrier 13 is transferred to the sputtering outlet chamber 35, the speed of the carrier 13 is increased, to thereby provide space from the following carrier in contact with it. After that, the gate valve 38d is set in an open state, and the carrier 13 is transferred to the unload lock chamber 36. At this time, the unload lock chamber 36 is maintained in a vacuum state.

When the carrier 13 is transferred to the unload lock chamber 36, the gate valve 38d is set in a closed state. After that, the carrier 13 is transferred through the unload lock chamber 36. Then, the gate valve 38e is set in an open state. Subsequently, the carrier 13 is transferred to the third rotation portion 24 under an atmospheric pressure.

The carrier 13, which has been transferred to the third rotation portion 24, is rotated substantially 90 degrees about a vertical axis on a rotary table 79, and is then transferred to the fourth rotation portion 25. In the fourth rotation portion 25, the carrier 13 is further rotated substantially 90 degrees about a vertical axis on a rotary table 79, setting the carrier 13 in an orientation that allows for the transfer to the transfer portions 26. Then, the carrier 13 is transferred to the transfer portion 26. The carrier 13 is transferred through the transfer portions 26, and is then guided to the outlet portion 27.

When the carrier 13 is transferred to the outlet portion 27, the glass substrate 11 after deposition that is mounted on the carrier 13 is removed. Then, the glass substrate 11 is transferred to an apparatus in the next step.

Here, in the deposition apparatus 10, it is configured such that two deposition treatment passages 17 are formed in parallel, allowing for deposition from both sides in the sputtering chamber 34. That is, two pairs of carriers 13 are arranged in parallel in the sputtering chamber 34, allowing for the simultaneous deposition on the glass substrates 11 mounted on each carrier 13. The number of the deposition treatment passages 17 formed may be only one.

In the case of such deposition apparatus 10, a deposition prevention plate for preventing deposition on the cathode member 80 as a target or on the inside of the sputtering chamber 34, or the like is provided on both side surfaces 72 of the sputtering chamber 34. The cathode member 80 and the deposition prevention plate require maintenance such as replacement and regular checkup. It is configured such that, at this time, maintenance is performed with the side surfaces 72 of the sputtering chamber 34 being reclined on the floor surface, that is, with the surfaces to which a target and the like are attached being made horizontal.

(Maintenance Method of Sputtering Chamber)

A mechanism where the cathode member 80 of the sputtering chamber 34 is maintained will be described.

As shown in FIG. 2, to maintain the cathode member 80 provided on the side surface 72 of the sputtering chamber 34, the side surface 72 reclines so as to be substantially parallel to the floor surface FL.

It is configured such that, when the side surface 72 reclines, the side surface 72 pivots about the rotational movement shaft 74 until it is in a horizontal state. At this time, the side surface 72 pivots while the shaft portion 82 that is joined to the legs 76 integrally formed with the side surface 72 is being rotationally moved about the rotational movement shaft 84 and also being extended by the power cylinder mechanism. When the front ends of the legs 76 are positioned on the floor surface FL, it is possible to support the load of the side surface 72 on which the cathode member 80 is arranged and to hold the side surface 72 in a horizontal state.

(Operation Method of Frame)

Figure 10:
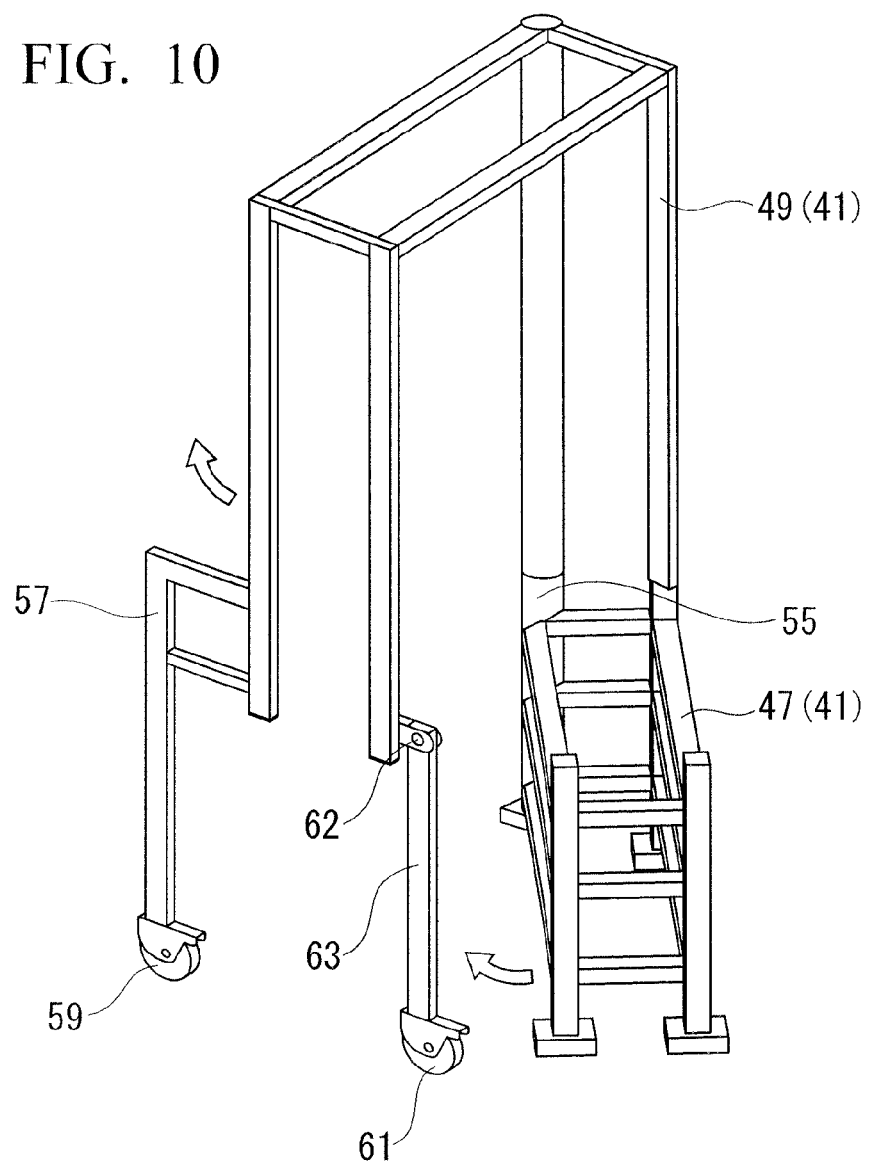
FIG. 10 is a schematic explanatory diagram showing the conveyor when an upper frame is moved according to the embodiment of the present invention.

Next is a description of an operation of the frame 41 when the maintenance mechanism 71 of the sputtering chamber 34 is activated, with reference to FIG. 10.

FIG. 10 is a schematic explanatory diagram when the upper frame of the conveyor is moved.

As shown in FIG. 10, when the latch portion (not shown in the figure) that locks the upper frame 49 and the lower frame 47 of the frame 41 is disengaged and the handle 57 of the upper frame 49 is pulled to the near side, the upper frame 49 moves as if rotationally moving about the vertical shaft 55 that is joined between the upper frame 49 and the lower frame 47. At this time, the load of the upper frame 49 is supported by the vertical shaft 55 and the first roller 59. After the upper frame 49 is rotationally moved to the position where the site on which the second roller 61 is attached ceases to interfere with the lower frame 47 when seen in a planar view, the stopper (not shown in the figure) of the second roller 61 is removed, and the second roller 61 is rotationally moved about the rotational movement shaft 62 so as to be brought into contact with the floor surface FL. In this state, the upper frame 49 is further rotationally moved substantially 90 degrees. At this time, the load of the upper frame 49 is supported at three points by the vertical shaft 55, the first roller 59, and the second roller 61. Therefore, it is possible to rotationally move the upper frame 49 without rattling by own weight of the upper frame 49.

Figure 11:
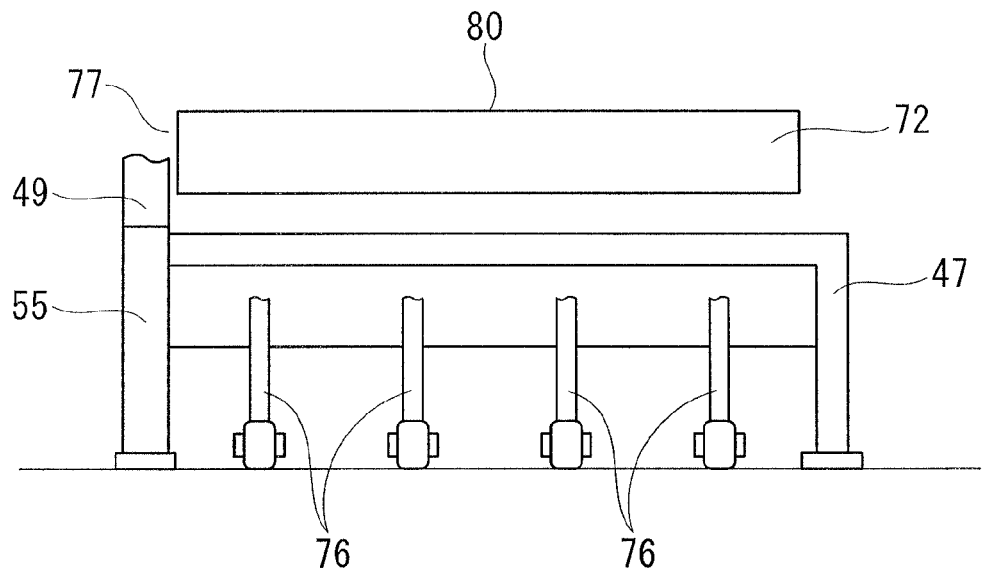
FIG. 11 is a schematic explanatory diagram showing a positional relationship between a side surface of the sputtering chamber and a lower frame when the side surface is reclined according to the embodiment of the present invention.

FIG. 11 is a schematic explanatory diagram showing a positional relationship between the side surface 72 of the sputtering chamber and the lower frame 47 when the side surface 72 reclines.

Figure 13:
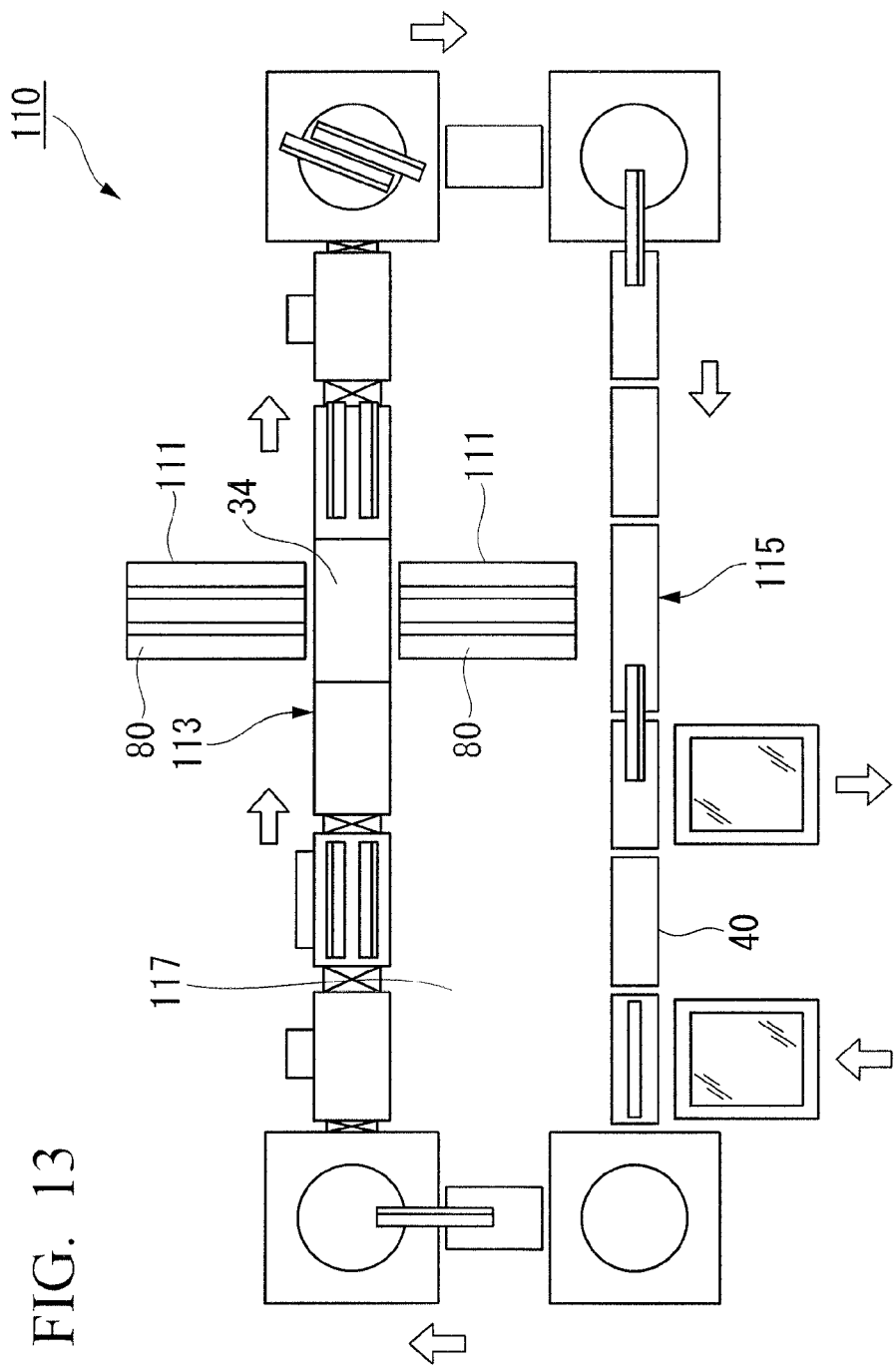
FIG. 13 is a schematic diagram showing a general constitution of a conventional deposition apparatus.

As shown in FIG. 11, when the upper frame 49 is moved, a space 77 is formed above the lower frame 47. The side surface 72 of the sputtering chamber 34 reclines into the space 77, and is arranged so as to overlap the lower frame 47 when seen in a planar view (see FIG. 1). Furthermore, it is configured such that the lower frame 47 and the side surface 72 do not interfere with each other in the up-down direction (the vertical direction). That is, the side surface 72 is arranged above the lower frame 47. This eliminates the necessity of arranging the deposition treatment passage 17 and the carrier transfer passage 15 so that the side surface 72 of the reclined sputtering chamber 34 and the carrier transfer passage 15 do not overlap when seen in a planar view (see FIG. 13). As a result, it is possible to bring the deposition treatment passage 17 and the carrier transfer passage 15 closer to each other (see FIG. 1). That is, the inner court 81 formed in the deposition apparatus 10 can be made narrow, making it possible to make the installation area of the deposition apparatus 10 small and narrow. Here, the legs 76 each made of a power cylinder are designed to be capable of finding their ways below the lower frame 47 (see FIG. 11).

On completion of the maintenance of the side surface 72, the side surface 72 is returned to its original position. After that, the upper frame 49 is rotationally moved to be returned to its original position. At this time, at the position where the second roller 61 interferes with the lower frame 47, the second roller 61 is once moved (retracted) to the upper frame 49 side, and then the upper frame 49 is rotationally moved as if being pressed toward the lower frame 47. Furthermore, on the upper frame 49, the stopper member 78 is provided that is configured to come in abutment with the lower frame 47 so as not to allow for the over rotational movement thereof, to thereby prevent a rotational movement more than that (see FIG. 4). After the stopper member 78 is in abutment with the lower frame 47, the upper frame 49 and the lower frame 47 are latched with the latch portion, to thereby set the inside of the frame 41 in a state that allows the carrier 13 to be transferred. Then, the second roller 61, which has been moved to the upper frame 49 side, is again moved to be grounded on the floor surface FL in order to support the load of the upper frame 49.

It is permissible that the frame 41 rotationally movable in this manner be arranged at a position that corresponds to the width of the side surface 72 of the sputtering chamber 34. If the side surface 72 has a width too large to be covered by a single frame 41, two frames 41 are made rotationally movable, and also the frames 41 are also arranged so as to be openable to left and right. Thereby, it is possible to cover the width for two frames.

According to the present embodiment, a conveyor 40 includes a frame 41, a lower support mechanism 43 for supporting a carrier 13 on which is longitudinally mounted a glass substrate 11 and for transferring the carrier 13, and an upper support mechanism 45 for supporting the carrier 13. The frame 41 includes a lower frame 47 and an upper frame 49, and in which the lower support mechanism 43 is provided on the lower frame 47 and the upper support mechanism 45 is provided on the upper frame 49, the upper frame 49 and the lower frame 47 being configured to be separately movable.

Furthermore, the lower support mechanism 43 is attached to the lower frame 47, and transfers the carrier 13 while supporting the load of the carrier 13 by means of the lower support mechanism 43. Therefore, it is possible to accurately transfer the carrier in a state with a transfer route of the lower support mechanism 43 being accurately positioned. Consequently, it is possible to prevent cracking of the glass substrate 11 mounted on the carrier 13, an occurrence of particles from the carrier 13, and transfer trouble.

Furthermore, the lower frame 47 is fixed on the floor surface FL, and the upper frame 49 is joined to a vertical shaft 55, of the lower frame 47, that is fixed on the floor surface FL, the upper frame 49 being configured to be rotationally movable about the vertical shaft 55.

In this case, only the upper support mechanism 45 can be rotationally moved in a state with the lower support mechanism 43 being fixed. Therefore, it is possible to retain the accuracy of the lower support mechanism 43. Furthermore, the upper frame 49 is configured to be rotationally movable about the vertical shaft 55 that fixes the lower frame 47 on the floor surface FL. Therefore, it is possible to form a space 77 above the lower frame 47 with ease, and also to return and position the upper frame 49 above the lower frame 47 with ease.

Furthermore, the upper support mechanism 45 is configured to support the carrier 13 in a non-contact manner.

With this configuration, it is possible to securely transfer the carrier 13 without affecting the transfer of the carrier 13 even if the position of the upper frame 49 (the upper support mechanism 45) is slightly displaced.

Furthermore, on a side surface 56 on a near side in a rotational movement direction of the upper frame 49, a first roller 59 is provided that rolls along the floor surface FL while supporting the upper frame 49 on the floor surface FL. On a side surface 60 on a far side in the rotational movement direction of the upper frame 49, a second roller 61 is provided that rolls along the floor surface FL while supporting the upper frame 49 on the floor surface FL. And the second roller is configured to be movable to a position that does not interfere with the lower frame 47 when the upper frame 49 is rotationally moved. In particular, the second roller 61 is provided at a front end of a leg 63. The leg 63 is connected to the upper frame 49 via a rotational movement shaft 62. It is configured such that, when the upper frame 49 is rotationally moved, the second roller 61 is movable to a position that does not interfere with the lower frame 47 after being flipped upward as a result of a rotational movement as if drawing a substantial semicircle in a vertical cross-section about the rotational movement shaft 62.

In this case, when the upper frame 49 is rotationally moved, it is possible to support the load of the upper frame 49 on the floor surface FL at three points by the vertical shaft 55 joined to the lower frame 47, the first roller 59, and the second roller 61. Therefore, it is possible to rotationally move the upper frame 49 securely without allowing the upper frame reclines by its own weight. Furthermore, the second roller 61 is configured to be movable while avoiding the interference with the lower frame 47. Therefore, in the rotational movement of the upper frame 49, only when the second roller 61 interferes with the lower frame 47, the second roller 61 is moved. At other times, the second roller 61 can be used for supporting the upper frame 49 on the floor surface FL, leading to efficient use.

Furthermore, a deposition apparatus 10 includes a carrier 13 for transferring a glass substrate 11 while longitudinally supporting the glass substrate 11, a deposition treatment passage 17 for performing a deposition treatment on the glass substrate 11 mounted on the carrier 13, and a carrier transfer passage 15 that is arranged in parallel with the deposition treatment passage 17. In the deposition apparatus 10 a cathode member 80 provided on a side surface 72 of a sputtering chamber 34 of the deposition treatment passage 17 is configured to be movable as if reclining toward the carrier transfer passage 15. On the carrier transfer passage 15 is provided an upper frame 49 which is separated from the lower frame 47 including the lower support mechanism 43 of the carrier 13 and includes the upper support mechanism 45 of the carrier 13. The upper frame 49 is configured to be movable to a position capable of avoiding interference with the cathode member 80 that has been moved (a retracted position).

In this case, the upper frame 49 can be moved to form a space 77 above the lower frame 47. And also the cathode member 80 can be provided on the side surface 72 of the sputtering chamber 34 that has been moved can be arranged in the space 77. Therefore, it is possible to bring the deposition treatment passage 17 and the carrier transfer passage 15 closer together. Consequently, it is possible to make the installation area of the deposition apparatus 10 small and narrow.

When the cathode member 80 provided on the side surface 72 of the sputtering chamber 34 is maintained, a rotational movement of the upper frame 49 can arrange the cathode member 80 in the space 77 formed above the lower frame 47. Therefore, it is possible to narrow the spacing between the deposition treatment passage 17 and the carrier transfer passage 15. Consequently, because the inner court 81 of the deposition apparatus 10 can be narrowed, it is possible to reduce the size and width the installation area of the deposition apparatus 10 including the deposition treatment passage 17 and the carrier transfer passage 15.

The technical scope of the present invention is not limited to the above-mentioned embodiment and includes those in which various modifications are made to the aforementioned embodiment without departing from the spirit or scope of the present invention. That is, specific materials, configuration, and the like listed in the embodiment are only exemplary, and appropriate modifications can be made.

Figure 12:
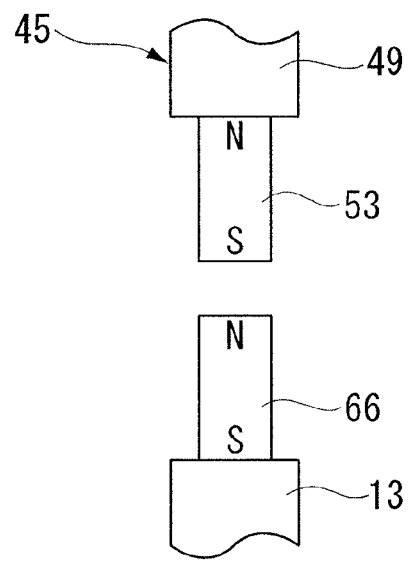
FIG. 12 is a schematic diagram showing another constitution of the upper support mechanism of the conveyor according to the embodiment of the present invention.

For example, in the present embodiment, the upper support mechanism 45 has a construction where the magnet provided on the upper frame 49 and the magnet provided on the carrier 13 repel each other. However, as shown in FIG. 12, it may be configured such that a single magnet 53 provided on the upper frame 49 and a single magnet 66 provided on the carrier 13 are opposed to each other in the vertical direction, and also that the magnets 53, 66 attract each other, to thereby make it possible to hold the carrier 13 substantially upright.

Furthermore, in the present embodiment, the description has been for a case where a deposition treatment passage on the double-side deposition system is adopted. However, the present invention may be applied to a deposition apparatus on the single-side deposition system in which maintenance is configured to be performed with the cathode member provided on the side surface of the sputtering chamber being reclined on the carrier transfer passage side.

INDUSTRIAL APPLICABILITY

According to the present invention, it is possible to reduce the size and width of the installation area thereof.

What is claimed is:

1. A conveyor for transferring a carrier which holds a substrate, comprising:
   a frame having a lower frame and an upper frame;
   a lower support mechanism provided on an upper surface of the lower frame for supporting a bottom edge portion of the carrier from below; and
   an upper support mechanism provided on a lower surface of the upper frame for supporting a top edge portion of the carrier from above;
   lower support mechanism and the upper support mechanism hold the carrier substantially upright therebetween; and wherein the upper frame and the lower frame being configured to be separately rotatable in a horizontal direction.

2. The conveyor according to claim 1, wherein the lower frame is supportedly fixed on a floor surface, and the upper frame is joined to any one of vertical shafts that support the lower frame on the floor surface, the upper frame being configured to be rotationally movable about the vertical shaft.

3. The conveyor according to claim 1, wherein the upper support mechanism supports the carrier in a non-contact manner.

4. The conveyor according to claim 1, further comprising:
   a first roller that rolls along the floor surface while supporting the upper frame on the floor surface is provided on a near side in a rotational movement direction of the upper frame;
   a second roller that rolls along the floor surface while supporting the upper frame on the floor surface is provided on a far side in the rotational movement direction of the upper frame; and
   wherein the second roller is configured to be movable to a position that does not interfere with the lower frame when the upper frame is rotationally moved.

5. The conveyor according to claim 1, wherein
   the carrier includes a first magnet attached on the top edge thereof,
   the upper support mechanism include a pair of second magnets provided on the lower surface of the upper frame so that the first magnet of the carrier is arranged therebetween, and
   a N pole of one of the second magnets is opposed to a N pole of the first magnet and that a S pole of the other one of the second magnets is opposed to a S pole of the first magnet.

* * * * *